United States Patent
Park et al.

(10) Patent No.: US 7,826,278 B2
(45) Date of Patent: Nov. 2, 2010

(54) SEMICONDUCTOR MEMORY DEVICE FOR GENERATING CORE VOLTAGE

(75) Inventors: Jae-Boum Park, Kyoungki-do (KR); Seok-Cheol Yoon, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 122 days.

(21) Appl. No.: 12/165,118

(22) Filed: Jun. 30, 2008

(65) Prior Publication Data
US 2009/0059681 A1 Mar. 5, 2009

(30) Foreign Application Priority Data
Aug. 29, 2007 (KR) ...................... 10-2007-0087231

(51) Int. Cl.
*G11C 7/00* (2006.01)
(52) U.S. Cl. ........................... 365/189.07; 365/189.09; 365/189.11; 365/226; 365/230.03
(58) Field of Classification Search ............ 365/189.07, 365/189.09, 189.11, 226, 230.03
See application file for complete search history.

(56) References Cited
U.S. PATENT DOCUMENTS
5,892,386 A 4/1999 Lee et al.

| 6,504,783 | B2 | 1/2003 | Jo |
| 6,791,308 | B2 * | 9/2004 | Shim .......................... 323/314 |
| 6,828,848 | B2 * | 12/2004 | Lee ............................. 327/534 |
| 6,867,641 | B2 | 3/2005 | Kang et al. |
| 6,947,347 | B2 | 9/2005 | Fujioka |
| 6,958,947 | B2 | 10/2005 | Park et al. |
| 2004/0001385 | A1 | 1/2004 | Kang |
| 2009/0116303 | A1* | 5/2009 | Kim ...................... 365/189.07 |

FOREIGN PATENT DOCUMENTS

| JP | 08-147998 | 6/1996 |
| JP | 10-125097 | 5/1998 |
| JP | 2002-170387 | 6/2002 |
| JP | 2003-085977 | 3/2003 |
| KR | 2001-0069196 | 7/2001 |

OTHER PUBLICATIONS

Kim, D. Y et al., "The Three-Stage Operational Amplifier Design For High Speed Signal Processing", ETRI, Jul. 1990.

* cited by examiner

*Primary Examiner*—Connie C Yoha
(74) *Attorney, Agent, or Firm*—IP & T Group LLP

(57) ABSTRACT

Semiconductor memory device includes a detection circuit configured to detect a voltage level of an external power supply voltage and a core voltage generation circuit configured to vary a voltage level of the core voltage according to an output signal of the detection circuit to generate a uniform core voltage.

11 Claims, 3 Drawing Sheets

SEMICONDUCTOR MEMORY DEVICE FOR GENERATING CORE VOLTAGE

CROSS-REFERENCE TO RELATED APPLICATION

The present invention claims priority of Korean patent application number 10-2007-0087231, filed on Aug. 29, 2007, which is incorporated by reference in its entirety.

BACKGROUND OF THE INVENTION

The present invention relates to a semiconductor memory device, and more particularly, to a core voltage generation circuit for generating core voltage.

A semiconductor memory device is used in storing data in a variety of applications. Such a semiconductor memory device is widely used in desktop computers, notebook computers and portable electronic apparatuses. Therefore, there is a need for the semiconductor memory device of large capacity, high speed, small size and low power.

In order to achieve the semiconductor memory device of low power, a method for minimizing power consumption in a core area of the memory device has been proposed. The core area includes a memory cell, a bit line and a word line, and is designed according to an ultra-fine design rule. To design an ultra-fine semiconductor memory device for performing high frequency operations, it is essential to lower power source voltage.

The semiconductor memory device uses an internal voltage of a voltage level adequate for operations in an internal circuit of the semiconductor memory device, which is generated by an external power supply voltage (VDD) lower than a certain voltage level. A memory device, such as a dynamic random access memory (DRAM), which utilizes a bit line sense amplifier, uses a core voltage (VCORE) to sense cell data. When a word line is enabled, data in a plurality of memory cells connected to the word line are transferred to bit lines, and then the bit line sense amplifiers sense and amplify voltage differences of bit line pairs. Generally, thousands of bit line sense amplifiers are operated at the same time. Thus, a large amount of current is consumed at a time at a core voltage terminal to drive pull-up power lines of the bit line sense amplifiers.

FIG. 1 is a circuit diagram of a conventional core voltage generation circuit.

Referring to FIG. 1, the conventional core voltage generation circuit includes a comparator 10, an amplifier 11 and a feedback voltage generator 12. The comparator 10 differentially compares a feedback voltage of half the core voltage (one half of the voltage level of a potential at a core voltage terminal) and a reference voltage (VREFC) (of one half of the voltage level of a target core voltage; 0.75 V). The amplifier 11 amplifies a core voltage to approximately 1.5 V in response to an output signal of the comparator 10. The feedback voltage generator 12 divides the amplified core voltage, and generates the feedback voltage having one half of the voltage level of the potential at the core voltage terminal to monitor the core voltage. The conventional core voltage generation circuit further includes a control switch 13 configured to control operations of the comparator 10.

The core voltage generation circuit determines the operation point of the comparator 10 using an external power supply voltage VDD applied to an NMOS transistor MN1 constituting the control switch 13.

As the NMOS transistor MN1 is turned on in response to the external power supply voltage VDD and the NMOS transistor MN2 is turned on in response to the reference voltage VREFC applied from the outside, drain voltages of the transistors MN1 and MN2 are lowered. That is, the potential of the node N1 is lowered. Then, a low level signal is applied to a gate of a PMOS transistor MP3 to turn on the PMOS transistor MP3 and thus increase the core voltage VCORE output from the core voltage generation circuit.

As the core voltage VCORE is increased, the feedback voltage is also increased to turn on an NMOS transistor MN3. As the NMOS transistor MN3 is turned on, a potential of the node N2 is decreased to decrease a voltage level applied to gates of the PMOS transistors MP1 and MP2. The decrease of the voltage level at the gates of the PMOS transistors MP1 and MP2 turns on the PMOS transistors MP1 and MP2 to gradually increase a potential of the node N1. That is, a gate voltage of the PMOS transistor MP3 is gradually increased. Such operations are repeated until the feedback voltage becomes equal to the reference voltage VREFC.

Such a conventional core voltage generation circuit includes a two-stage amplifier having resistor-type connection of two transistors in a negative feedback configuration. As a result, a closed loop gain approaches 2 as an open loop gain approaches infinity, and thus the core voltage generation circuit generates a core voltage of a voltage level two times as high as the reference voltage VREFC.

However, such a conventional core voltage generation circuit has at least two poles. Accordingly, a phase margin, which is required in a high frequency operation, is not sufficient, and thus system stability may be reduced.

In addition, the conventional core voltage generation circuit performs the same controls regardless of whether the external power supply voltage is higher or lower than the reference voltage. That is, the generation of the core voltage is controlled by the two-stage amplifier employing the same feedback using the same circuit elements. Therefore, the conventional core voltage generation circuit has the limitation that the output level of the core voltage is not constant, for example, the output core voltage is high when the external power supply voltage is high, and the output core voltage is low when the external power supply voltage is low.

SUMMARY OF THE INVENTION

Embodiments of the present invention are directed to providing a semiconductor memory device that generates a stable core voltage regardless of a voltage level of an external power supply voltage input thereinto.

Embodiments of the invention are also directed to providing a semiconductor memory device that secures sufficient phase margin and gain margin regardless of variations in an external power supply voltage to generate a stable core voltage.

In accordance with an aspect of the invention, there is provided a detection circuit configured to detect a voltage level of an external power supply voltage and a core voltage generation circuit configured to vary a voltage level of the core voltage according to an output signal of the detection circuit to generate a uniform core voltage.

DESCRIPTION OF SPECIFIC EMBODIMENTS

Hereinafter, a semiconductor memory device in accordance with the present invention will be described in detail with reference to the accompanying drawings.

As will be described below, a semiconductor memory device in accordance with embodiments of the invention detects variations in an external power supply voltage to vary a voltage level of a core voltage according to the detection result, thereby generating uniform core voltage. The variation of the voltage level of the core voltage can be performed by varying amplification degree of the external power supply voltage, which serves as a source voltage for generating the core voltage, according to the detection result.

Figure 1:
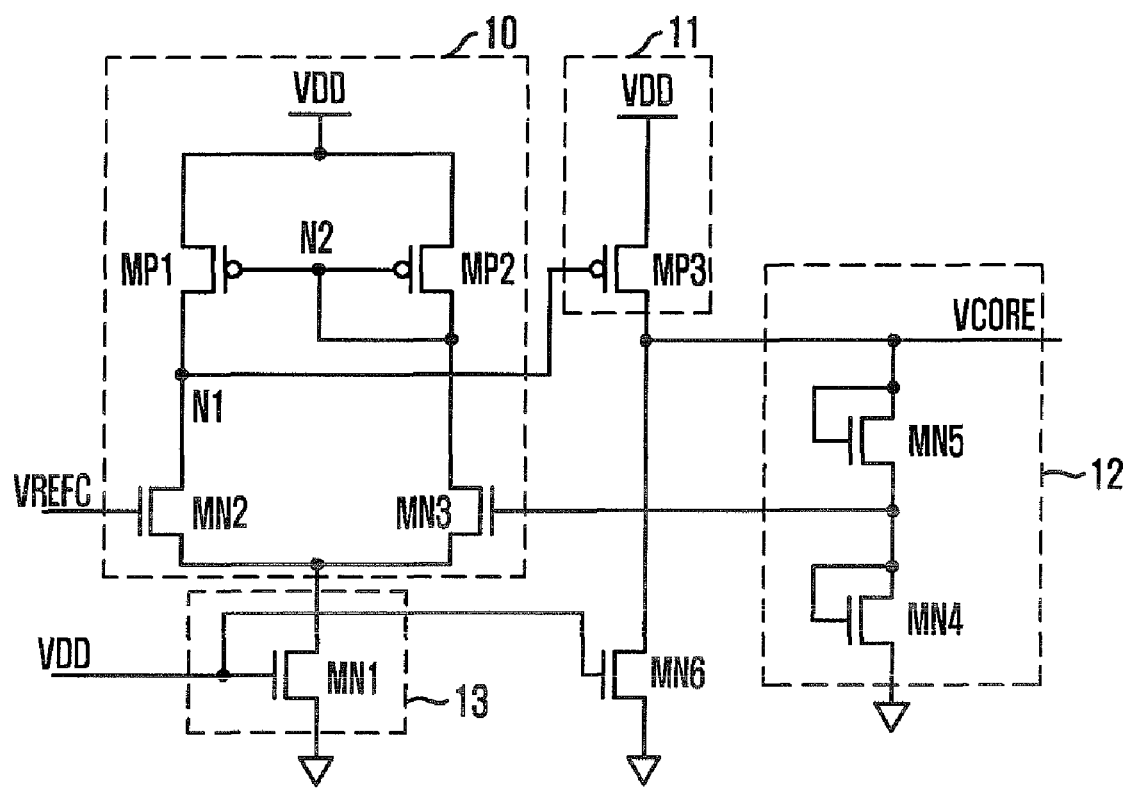
FIG. 1 is a circuit diagram of a conventional core voltage generation circuit.
Figure 2:
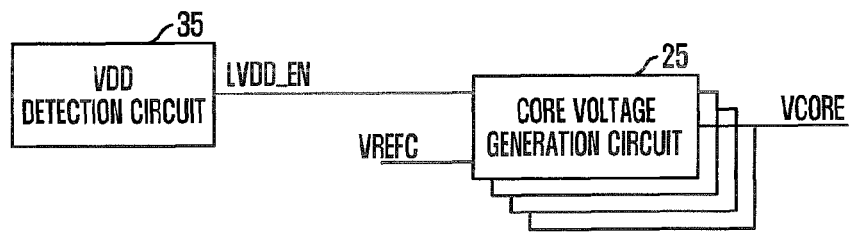
FIG. 2 is a block diagram of a semiconductor memory device in accordance with an embodiment of the present invention.

FIG. 2 is a block diagram of a semiconductor memory device in accordance with an embodiment of the invention. Referring to FIG. 2, the semiconductor memory device includes a VDD detection circuit 35 and a core voltage generation circuit 25. The VDD detection circuit 35 detects a voltage level of an external power supply voltage VDD to generate a low external power supply voltage enable signal LVDD_EN according to the detected voltage level. The core voltage generation circuit 25 includes a phase compensator. The phase compensator operates differently when the external power supply voltage is in a high level state and when it is in a low level state. As such, the phase compensator can secure a sufficient phase margin according to the detection result of the VDD detection circuit 35 while maintaining a negative feedback characteristic. As a result, the core voltage generation circuit 25 can generate a stable core voltage.

The VDD detection circuit 35 compares a voltage level of a predetermined portion of the external power supply voltage VDD with a voltage level of a reference voltage VREF. If the voltage level of the predetermined portion of the external power supply voltage VDD is lower than the voltage level of the reference voltage VREF, the VDD detection circuit 35 generates a high level signal, i.e., a low external power supply voltage LVDD_EN of a high level. If the voltage level of the predetermined portion of the external power supply voltage VDD is higher than the voltage level of the reference voltage VREF, the VDD detection circuit 35 generates a low level signal, i.e., a low external power supply voltage LVDD_EN of a low level. Detailed description of configuration and operation of the VDD detection circuit 35 will be given later with reference to FIG. 4.

The reference voltage VREF is used as a reference for comparison with the external power supply voltage VDD. The reference voltage VREF has a voltage level within a predetermined voltage range (experimental value) of the rated external power supply voltage. Accordingly, the external power supply voltage VDD having a voltage level slightly lower than the predetermined voltage range of the rated external power supply voltage is referred to as an external power supply voltage in a low level region. The external power supply voltage VDD having a voltage level slightly higher than the predetermined voltage range of the rated external power supply voltage is referred to as an external power supply voltage in a high level region.

If a low level signal is output from the VDD detection circuit 35, the core voltage generation circuit 25 determines that the external power supply voltage VDD is in the high level region of the external power supply voltage. Then, the core voltage generation circuit 25 secures a phase margin for a two-stage amplifier while maintaining a negative feedback characteristic using a first compensator operating in the high level region of the external power supply voltage. As a result, the core voltage generation circuit 25 configured with the two-stage amplifier can generate a stable core voltage while securing a sufficient phase margin in the high level region of the external power supply voltage.

On the contrary, if a high level signal is output from the VDD detection circuit 35, the core voltage generation circuit 25 determines that the external power supply voltage is in the low level region of the external power supply voltage. Then, the core voltage generation circuit 25 secures the phase margin for the two-stage amplifier while maintaining the negative feedback characteristic using a second compensator operating in the low level region of the external power supply voltage. As a result, the core voltage generation circuit 25 configured with the two-stage amplifier can generate a stable core voltage while securing a sufficient phase margin in the low level region of the external power supply voltage.

Figure 3:
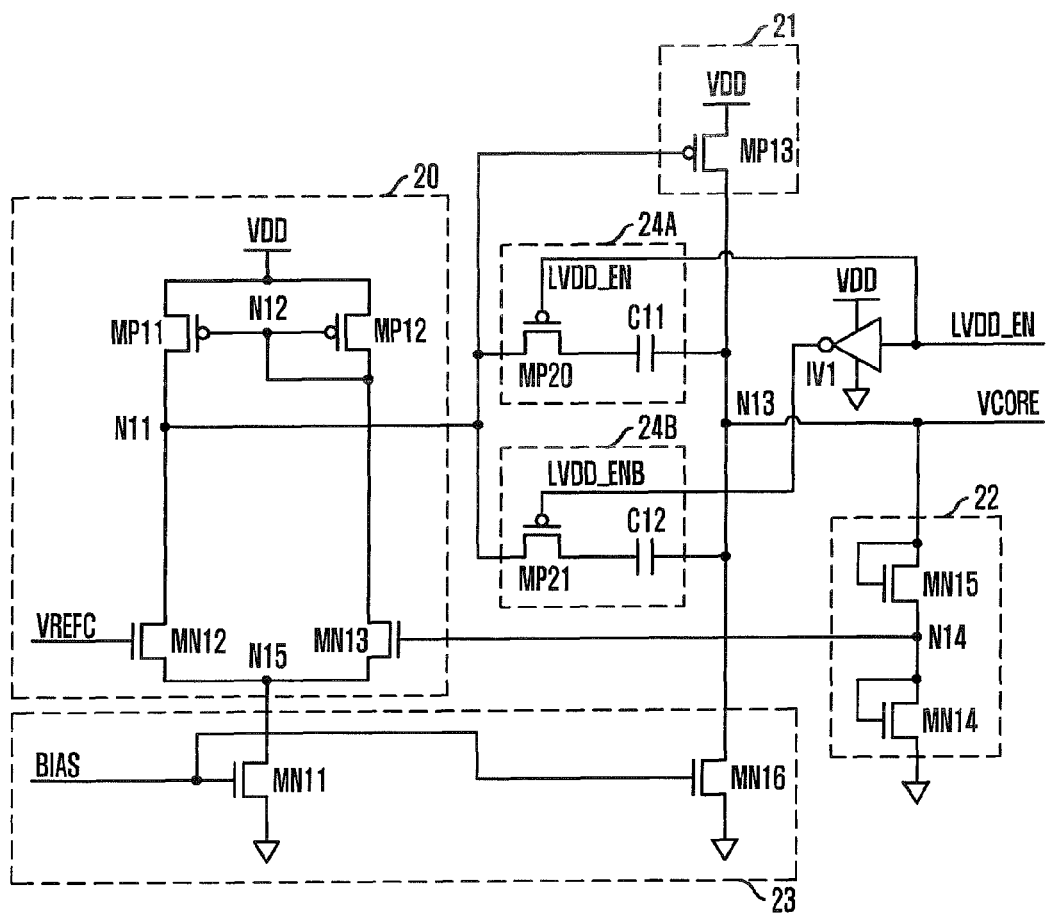
FIG. 3 is a circuit diagram of a core voltage generation circuit of the semiconductor memory device of FIG. 2.

Hereinafter, a method for generating a stable core voltage by operating one of the compensators according to the voltage level of the external power supply voltage VDD will be described with reference to FIG. 3. FIG. 3 is a circuit diagram of the core voltage generation circuit of the semiconductor memory device of FIG. 2.

Referring to FIG. 3, the core voltage generation circuit 25 includes a comparator 20, an amplifier 21, a feedback voltage generator 22 and a control switch 23. The comparator 20 differentially compares a feedback voltage and a reference voltage VREFC. The feedback voltage may be a half core voltage having one half of the voltage level of the potential of the core voltage terminal. The reference voltage VREFC has one half of the voltage level of a target core voltage (0.75V). The amplifier 21 amplifies a core voltage to approximately 1.5 V in response to an output signal of the comparator 20. The feedback voltage generator 22 divides the amplified core voltage to generate the feedback voltage having one half of the voltage level of the potential of the core voltage terminal for monitoring the core voltage. The control switch 23 opens and closes current paths of the comparator 20 and the amplifier 21 to enable and disable the comparator 20 and the amplifier 21.

The core voltage generation circuit 25 further includes a first compensator 24A to secure a negative feedback characteristic of a two-stage amplifier. The first compensator 24A has an RC circuit connected between a gate and a drain of a PMOS transistor MP13 constituting the amplifier 21. The first compensator 24A is operated by a low external power supply voltage enable signal LVDD_EN in a high level region of the external power supply voltage.

The core voltage generation circuit 25 further includes a second compensator 24B to secure a negative feedback characteristic of the two-stage amplifier. The second compensator 24B has an RC circuit connected between the gate and the drain of the PMOS transistor MP13 constituting the amplifier 21. The second compensator 24B is operated by the low external power supply voltage enable signal LVDD_EN in a low level region of the external power supply voltage.

The comparator 20 includes two NMOS transistors MN12 and MN13 performing differential comparison in response to the reference voltage VREFC applied from the outside and the feedback voltage having one half of the voltage level of the core voltage. Sources of the two transistors MN12 and MN13 are connected to each other through a node N15. The reference voltage VREFC is applied to a gate of the transistor MN12, and the feedback voltage is applied to a gate of the transistor MN13. A drain of the transistor MN12 is connected in series to the PMOS transistor MP11 through a node N11. The external power supply voltage VDD is applied to a source of the PMOS transistor MP11. A drain of the transistor MN13 is connected in series to a PMOS transistor MP12, and a gate and a drain of the transistor MP12 is connected to each other through a node N12. A gate of the PMOS transistor MP11 is also connected to the node N12. The external power supply voltage VDD is applied to a source of the transistor MP12.

The amplifier 21 includes a PMOS transistor MP13 having a gate connected to the node N11, a source receiving the external power supply voltage VDD, and a drain outputting an amplified core voltage VCORE. An NMOS transistor MN16 is connected in series between the PMOS transistor MP13 and a ground voltage.

The control switch 23 includes NMOS transistors MN11 and MN16. The NMOS transistor MN11 has a drain connected to the node N15 of the comparator 20, a gate configured to receive a bias voltage BIAS from the outside, and a source connected to a ground voltage. The NMOS transistor MN16 has a drain connected to the node N13 of the amplifier 21, a gate receiving the bias voltage, and a source connected to the ground voltage.

The feedback voltage generator 22 includes NMOS transistors MN14 and MN15 connected in series to each other through a node N14. The NMOS transistors MN14 and MN15 are connected in series between an output terminal N13 for the core voltage generated by the amplifier 21 and the ground terminal. The node N14 is connected to the gate of the transistor MN13 of the comparator 20. A drain and a gate of the transistor MN14 are connected to each other, which is the same to the transistor MN15. That is, the core voltage is divided by the two transistors MN14 and MN15. The divided core voltage is transferred to a gate of the transistor MN13 of the comparator 20 to turn on the transistor MN13.

The first compensator 24A is configured with an RC circuit connected between an input terminal (gate) and an output terminal (drain) of the PMOS transistor MP13 constituting the amplifier 21. The RC circuit includes a PMOS transistor MP20 functioning as a resistor and a capacitor C11. The transistor MP20 is turned on in response to a low level signal (of the low external power supply voltage enable signal LVDD_EN) which is applied to a gate when the external power supply voltage VDD is in a high level region. Here, the capacitor 11 shifts two poles, and the resistor inserts zero. The first compensator 24A has an RC value that can secure sufficient phase margin and gain margin when the external power supply voltage is in the high level region.

The second compensator 24B is connected to the first compensator 24A in parallel. The second compensator 24B is configured with an RC circuit connected between an input terminal (gate) and an output terminal (drain) of the PMOS transistor MP13 constituting the amplifier 21. The RC circuit includes a PMOS transistor MP21 functioning as a resistor and a capacitor C12. The transistor MP21 is turned on in response to a high level signal (of the low external power supply voltage enable signal LVDD_EN) which is applied to a gate when the external power supply voltage VDD is in a low level region. Accordingly, when the low external power supply voltage enable signal LVDD_EN is a high level signal, the inverter IV1 inverts the high level signal to a low level signal to apply it to the gate of the PMOS transistor MP21. The second compensator 24B has an RC value that can secure sufficient phase margin and gain margin when the external power supply voltage VDD is in the low level region.

Hereinafter, an operation of the core voltage generation circuit in accordance with the embodiment of the invention will be described.

In order to operate the core voltage generation circuit 25 configured with the two-stage amplifier, there is a need for detecting the voltage level of the external power supply voltage VDD input thereto to determine whether the external power supply voltage VDD is in a high level region (of the external power supply voltage) or a low level region (of the external power supply voltage). As a result, a low external power supply voltage enable signal LVDD_EN is generated. Depending on the detected voltage level of the external power supply voltage, the compensators are selectively operated to secure a phase margin and a gain margin to thereby secure a negative feedback characteristic.

Therefore, the first and second compensators 24A and 24B are operated selectively according to the voltage level of the external power supply voltage VDD. This will be described later with reference to FIG. 4. When the divided external power supply voltage is lower than the reference voltage, the low external power supply voltage enable signal LVDD_EN is applied as a high level signal. The high level signal is inverted to a low level signal by the inverter IN1. As such, the high level signal turns off the transistor MP20 of the first compensator 24A, and the low level signal inverted from the high level signal by the inverter IV1 turns on the transistor MP21 of the second compensator 24B.

Then, the first compensator 24A is disabled and the second compensator 24B is enabled. Resultantly, between the gate and the drain of the PMOS transistor MP13 constituting the amplifier 21, the second compensator 24B is connected. That is, between the input terminal and the output terminal of the amplifier 21, the second compensator 24B is connected.

Meanwhile, the transistor MN11, which is a current source of the comparator 20, is turned on to form a current path of the comparator 20.

As the transistor MN12 is turned on by the reference voltage VREFC, voltage level of the node N11 is lowered, and as the transistor MN11 is turned on, voltage level of the node N15 is lowered. The potential of the node N11 varies in connection with that of the node N15. That is, as the potential of the node N15 is lowered, the potential of the node N11 is also lowered accordingly.

Here, the low level signal at the node N11 turns on the PMOS transistor MP13 constituting the amplifier 21 to apply an amplified core voltage to the node N13. Further, as the drain voltages of the transistor MN12 and MN11 are lowered, the turn on characteristic of the transistor MP13 is increased gradually, thereby increasing the output core voltage.

The feedback voltage for monitoring the core voltage is divided by the transistors MN15 and MN14 before being applied to the gate of the NMOS transistor MN13. The turning on of the transistor MN13 lowers the gate voltages of the PMOS transistors MP11 and MP12.

As the gate voltages of the transistors MP11 and MP12 are lowered, the transistors MP11 and MP12 are turned on, and thus the voltage level at the node N11 increases gradually. Resultantly, the gate voltage of the transistor MP13, which is turned on/off in response to the voltage of the node N11, is also increased gradually.

Since the transistor MP13 is a PMOS transistor, increase of the gate voltage decreases the turn on characteristic of the transistor MP13, thereby decreasing the output core voltage. As a result, the comparator 20 repeats the differential comparison until the feedback voltage for monitoring the core voltage becomes equal to the reference voltage VREFC.

The second compensator 24B connected between the input terminal and the output terminal of the amplifier 21 secures the phase margin and the gain margin between the input terminal and the output terminal of the amplifier 21. That is, the second compensator 24B is connected between the gate and the drain of the PMOS transistor MP13 constituting the amplifier 21. The gate of the PMOS transistor MP13 is connected to the node N11 which controls the turn on voltage of the transistor MP13. Therefore, the potential of the node N11 is compensated by the second compensator 24B. Resultantly, the output core voltage connected to the other side of the second compensator 24B compensates the potential of the node N11 stably.

Consequently, even if a load is changed suddenly or external noise is applied, the amplifier 21 can stabilize the core voltage in a short time while maintaining the negative feedback characteristic of the two-stage amplifier with the help of the second compensator 24B. Even if the external power supply voltage VDD for generating the core voltage is in a low level region, the compensator 24B allows the turn on characteristic of the transistor MP13 to be controlled stably, thereby generating a stable core voltage.

On the contrary, when the divided external power supply voltage is higher than the reference voltage, the low external power supply voltage enable signal LVDD_EN of a low level is applied. This signal turns on the transistor MP20 and is inverted by the inverter IV1 to turn off the transistor MP21. As a result, the first compensator 24A is enabled and the second compensator 24B is disabled. This results in a circuit including the PMOS transistor MP13 constituting the amplifier 21 and the first compensator 24A connected between the gate and the drain of the PMOS transistor MP13. That is, between the input terminal and the output terminal of the amplifier 21 is connected the first compensator 24A.

Meanwhile, the transistor MN11, which is a current source of the comparator 20, is turned on to form a current path for the comparator 20.

Then, the transistor MN12 is turned on in response to the reference voltage VREFC to lower the voltage level of the node N11, and the transistor MN17 is turned on to lower the voltage level of the node N15. The potential of the node N11 varies in connection with that of the node N15. That is, as the potential of the node N15 is lowered, that of the node N11 is also lowered.

The low level signal of the node N11 turns on the PMOS transistor MP13 constituting the amplifier 21 to apply the amplified core voltage to the node N13. Then, the drain voltages of the transistors MN12 and MN17 is lowered to make the turn on characteristic of the transistor MP13 increase gradually, thereby increasing the output core voltage.

The feedback voltage for monitoring the core voltage is divided by the transistors MN15 and MN14 before being applied to the gate of the NMOS transistor MN13. Then, the transistor MN13 is turned on to lower the gate voltages of the PMOS transistors MP11 and MP12.

As the gate voltages of the transistors MP11 and MP12 are lowered, the transistors MP11 and MP12 are turned on. As a result, the voltage of the node N11 is increased gradually, and thus the gate voltage of the transistor MP13, which is turned on in response to the voltage of the node N11, is also increased gradually.

Since the transistor MP13 is a PMOS transistor, the increase of the gate voltage reduces the turn on characteristic, thereby decreasing the output core voltage. The differential comparison is repeated until the feedback voltage for monitoring the core voltage becomes identical to the reference voltage VREFC.

The first compensator 24A connected to the input terminal and the output terminal of the amplifier 21 secures a phase margin and a gain margin between the input terminal and the output terminal of the amplifier 21. That is, the first compensator 24A is connected between the gate and the drain of the PMOS transistor MP13. The gate of the PMOS transistor MP13 is connected to the node N11, which controls the turn on voltage of the transistor MP13. Therefore, the potential of the node N11 is compensated by the first compensator 24A, and the output core voltage connected to the other side of the first compensator 24A resultingly compensates the potential of the node N11 to control it in a stable manner.

As such, even if a load is changed suddenly or an external noise is applied, the amplifier 21 can stabilize the core voltage in a short time while maintaining the negative feedback characteristic of the two-stage amplifier with the help of the first compensator 24A. Furthermore, even if the applied external power supply voltage VDD for generating the core voltage is in a high level region, the first compensator 24A can generate a stable core voltage while controlling the turn on characteristic of the transistor MP13 stably.

As described above, the core voltage generation circuit divides the possible voltage range of the external power supply voltage VDD to the high level region and the low level region. Then, depending on whether the external power supply voltage VDD is in the high level region or the low level region, the core voltage generation circuit selectively operates one of the compensators to control the turn on characteristic of the amplifier.

The two-stage amplifier is a two-pole system, and should secure a phase margin above 60 degrees depending on frequency stability. A typical method for securing the phase margin of the multi-pole system is Miller compensation. That is, a capacitor is connected between the input terminal and the output terminal of the amplifier 21 configured with the second amplifier to split two dominant poles and thereby to improve the stability. However, because the capacitor generates a feedforward path, a serial RC circuit is usually connected in order to remove the feedforward path. Further, by providing a resistor configured with a PMOS transistor between the node N13 and an output terminal to form a zero at the capacitor of the output terminal and the second pole, it is possible to improve the phase margin using the offset effect.

Therefore, the compensator includes an RC circuit, and the first compensator 24A operating in the high level region has an RC characteristic greater than that of the second compensator 24B operating in the low level region. Because of these differently established RC characteristics, sufficient phase margin and gain margin can be secured by the Miller compensation and thus a stable core voltage can be generated regardless of the variations in the external power supply voltage.

Figure 4:
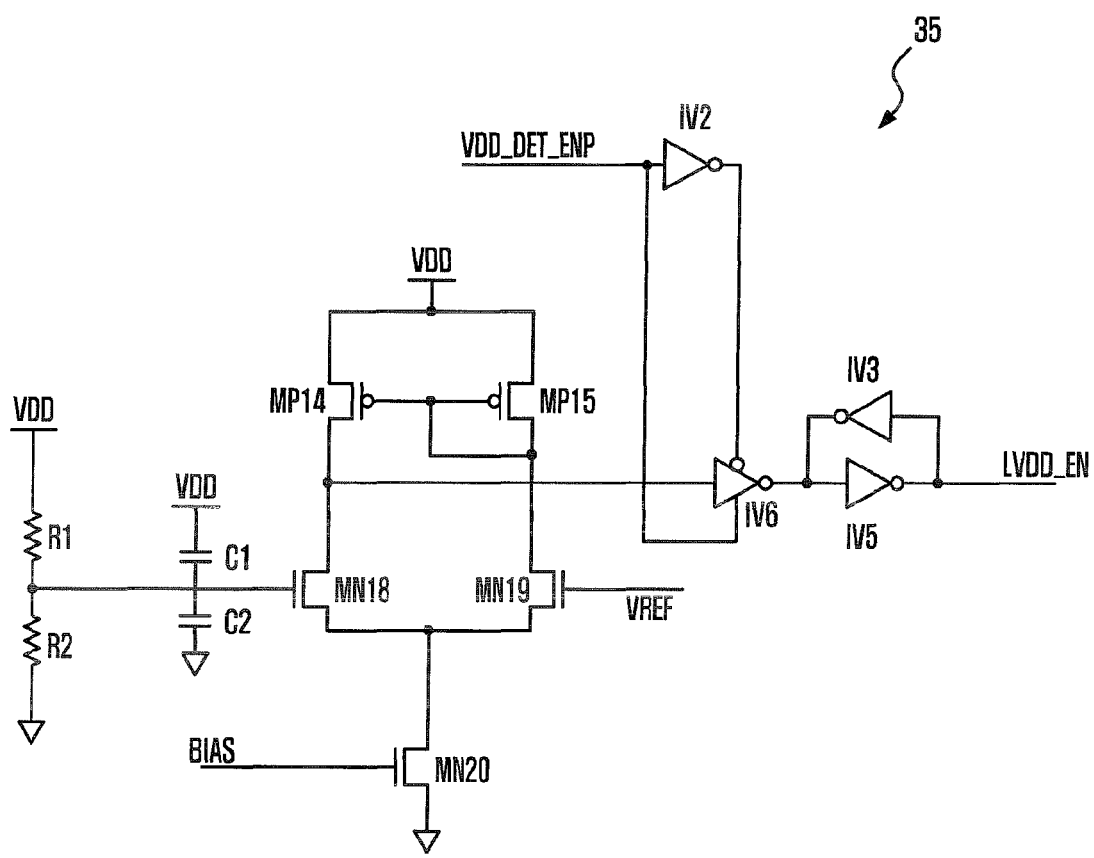
FIG. 4 is a circuit diagram of a VDD detection circuit of the semiconductor memory device of FIG. 2.

Hereinafter, the VDD detection circuit of the semiconductor memory device of FIG. 2 will be described with reference to FIG. 4.

The VDD detection circuit includes a voltage divider, a comparator, a switch, inverters IV6, IV5 and IV3 and an inverter IV2. The voltage divider includes resistors R1 and R2 and capacitors C1 and C2 to divide the external power supply voltage VDD. The comparator includes NMOS transistors MN18 and MN19 and PMOS transistors MP14 and MP15 to differentially compare the divided external power supply voltage received from the voltage divider and the reference voltage VREF. The switch includes an NMOS transistor MN20 for forming a current path for the comparator. The inverters IV6, IV5 and IV3 invert the comparison results. The inverter IV2 receives a pulse signal VDD_DET_ENP generated after the external power supply voltage is stabilized. The reference voltage VREF is predetermined to detect a voltage level of the external power supply voltage VDD.

In the VDD detection circuit, the voltage level of the external power supply voltage VDD is divided before being compared with the voltage level of the reference voltage. That is, when the voltage level of the divided external power supply voltage is higher than the voltage level of the reference voltage, the transistor MN18 is turned on so that the inverter IV6 outputs a high level signal. The high level signal is inverted by the inverter IV5 to a low level signal.

That is, when the voltage level of the divided external power supply voltage is higher than the voltage level of the reference voltage, the external power supply voltage is considered to be in a high level region. Then, the VDD detection circuit outputs a low external power supply voltage enable signal LVDD_EN of a low level.

On the contrary, when the voltage level of the divided external power supply voltage is lower than the voltage level of the reference voltage, the transistor MN19 is turned on so that the inverter IN6 outputs a low level signal. This low level signal is inverted by the inverter IV5 to a high level signal.

That is, when the voltage level of the divided external power supply voltage is lower than the voltage level of the reference voltage, the external power supply voltage is considered to be in a low level region. Then, the VDD detection circuit outputs a low external power supply voltage enable signal LVDD_EN of a high level.

As described above, the core voltage generation circuit in accordance with embodiments of the invention can improve a phase margin sufficient for the two-stage amplifier while maintaining the negative feedback characteristic using the RC circuit utilizing the Miller compensation. Particularly, the core voltage generation circuit divides possible voltage range of the external power supply voltage to the low level region and the high level region to secure a stable phase margin regardless of the variation in the external power supply voltage. Therefore, it is possible to secure a sufficient phase margin for maintaining the negative feedback characteristic of the two-stage amplifier and to generate a stable core voltage regardless of the voltage level of the external power supply voltage.

While the invention has been described with respect to the specific embodiments, it will be apparent to those skilled in the art that various changes and modifications may be made without departing from the spirit and scope of the invention as defined in the following claims.

For example, although it has been described that the voltage level the predetermined portion of the external power supply voltage is compared with the voltage level of the reference voltage to determine whether the external power supply voltage is in the high level region or the low level region, the invention is not limited thereto. That is, the possible range of the voltage level of the predetermined portion of the external power supply voltage may also be divided into more number of regions with finer voltage ranges, and thus the core voltage generation circuit may also be provided with more number of compensators.

What is claimed is:

1. A semiconductor memory device, comprising:
    a detection circuit configured to detect a voltage level of an external power supply voltage; and
    a core voltage generation circuit configured to vary a degree of amplification of the external power supply voltage according to the detected voltage level of the external power supply voltage to vary a voltage level of a core voltage to generate a uniform core voltage.

2. The semiconductor memory device as recited in claim 1, wherein the core voltage generation circuit comprises:
    a comparator configured to perform a differential comparison of a reference voltage and a feedback core voltage;
    an amplifier configured to amplify the external power supply voltage in response to an output signal of the comparator to generate the uniform core voltage; and
    a phase compensator configured to operate according to the voltage level of the external power supply voltage, the phase compensator being connected to an input terminal and an output terminal of the amplifier.

3. The semiconductor memory device as recited in claim 2, wherein the phase compensator is controlled by the output signal of the detection circuit.

4. The semiconductor memory device as recited in claim 3, wherein the phase compensator comprises at least one compensator configured to selectively operate according to the voltage level of the external power supply voltage.

5. The semiconductor memory device as recited in claim 4, wherein the detection circuit compares the external power supply voltage with the reference voltage to determine whether the voltage level of the external power supply voltage is in a high level region or a low level region; and
    the phase compensator comprises a first compensator circuit configured to operate when the voltage level of the external power supply voltage is in the high level region, and a second compensator circuit configured to operate when the voltage level of the external power supply voltage is in the low level region.

6. The semiconductor memory device as recited in claim 5, wherein the first and second compensator circuits each comprise a resistor configured with a PMOS transistor, and a capacitor.

7. The semiconductor memory device as recited in claim 6, wherein the output signal of the detection circuit selectively turns the first and second compensator circuits on or off.

8. The semiconductor memory device as recited in claim 7, wherein core voltage generation circuit further comprises an inverter configured to invert the output signal of the detection circuit, the inverter generating an inverter output signal that turns at least one of the first and second compensator circuits on or off.

9. The semiconductor memory device as recited in claim 3, wherein the core voltage generation circuit further comprises a feedback voltage generator connected between an output terminal of the amplifier and a ground voltage terminal to output the feedback core voltage to the comparator for monitoring the core voltage.

10. The semiconductor memory device as recited in claim 2, wherein the core voltage generation circuit further comprises a current source connected to the comparator to determine an operating point of the comparator.

11. The semiconductor memory device as recited in claim 2, wherein the core voltage generation circuit further comprises a current source connected to the amplifier to determine an operating point of the amplifier.

* * * * *